United States Patent
Kim et al.

(10) Patent No.: US 11,137,435 B2
(45) Date of Patent: Oct. 5, 2021

(54) SYSTEM AND METHOD OF TESTING A SEMICONDUCTOR DEVICE AND METHOD OF FABRICATING THE SEMICONDUCTOR DEVICE

(71) Applicant: SAMSUNG ELECTRONICS CO., LTD., Suwon-si (KR)

(72) Inventors: Junbae Kim, Seoul (KR); Yongho Cho, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 81 days.

(21) Appl. No.: 16/272,304

(22) Filed: Feb. 11, 2019

(65) Prior Publication Data

US 2020/0033389 A1    Jan. 30, 2020

(30) Foreign Application Priority Data

Jul. 26, 2018  (KR) ........................ 10-2018-0087209

(51) Int. Cl.
| | |
|---|---|
| *G01R 31/00* | (2006.01) |
| *G01R 1/04* | (2006.01) |
| *G01R 31/28* | (2006.01) |
| *G01R 31/26* | (2020.01) |

(52) U.S. Cl.
CPC ......... *G01R 31/002* (2013.01); *G01R 1/0466* (2013.01); *G01R 31/2642* (2013.01); *G01R 31/2863* (2013.01); *G01R 31/2867* (2013.01); *G01R 31/2887* (2013.01); *G01R 31/2896* (2013.01)

(58) Field of Classification Search
CPC combination set(s) only.
See application file for complete search history.

(56) References Cited

U.S. PATENT DOCUMENTS

| | | | | |
|---|---|---|---|---|
| 5,534,787 A | * | 7/1996 | Levy | G01R 1/06772 |
| | | | | 324/754.09 |
| 6,292,003 B1 | * | 9/2001 | Fredrickson | G01R 1/0483 |
| | | | | 324/750.25 |
| 6,492,825 B2 | * | 12/2002 | Choi | G01R 1/0433 |
| | | | | 324/750.25 |
| 7,043,848 B2 | | 5/2006 | Hollman et al. | |
| 7,170,169 B2 | | 1/2007 | Trout et al. | |
| 7,180,318 B1 | * | 2/2007 | Mahoney | G01R 1/07314 |
| | | | | 324/756.03 |
| 7,804,316 B2 | | 9/2010 | Ito et al. | |
| 8,230,593 B2 | * | 7/2012 | Kister | G01R 3/00 |
| | | | | 29/884 |

(Continued)

FOREIGN PATENT DOCUMENTS

| | | |
|---|---|---|
| KR | 10-2008-0009233 | 1/2008 |
| KR | 10-2008-0113884 | 12/2008 |
| KR | 10-2009-0075941 | 7/2009 |

*Primary Examiner* — Paresh Patel
(74) *Attorney, Agent, or Firm* — F. Chau & Associates, LLC

(57) ABSTRACT

A semiconductor device test system may include a body providing an internal space, in which a test device is loaded, and a cover coupled to the body to cover the internal space. The cover may include a first cover including first openings two-dimensionally arranged and a second cover including second openings two-dimensionally arranged. An arrangement of the first openings may be different from an arrangement of the second openings.

13 Claims, 13 Drawing Sheets

(56) References Cited

U.S. PATENT DOCUMENTS

| | | |
|---|---|---|
| 9,594,705 B2 | 3/2017 | Ebert |
| 2002/0039030 A1 | 4/2002 | Khazei |
| 2007/0296419 A1 | 12/2007 | Aizawa et al. |
| 2009/0174424 A1 | 7/2009 | Lee |
| 2012/0235700 A1 | 9/2012 | Iyer |
| 2020/0003802 A1* | 1/2020 | Lee .................... G01R 1/0466 |

* cited by examiner

SYSTEM AND METHOD OF TESTING A SEMICONDUCTOR DEVICE AND METHOD OF FABRICATING THE SEMICONDUCTOR DEVICE

CROSS-REFERENCE TO RELATED APPLICATION

This U.S. non-provisional patent application claims priority under 35 U.S.C. § 119 to Korean Patent Application No. 10-2018-0087209, filed on Jul. 26, 2018, in the Korean Intellectual Property Office, the disclosure of which is incorporated by reference herein in its entirety.

1. TECHNICAL FIELD

The present inventive concept relates to a system and a method of testing a semiconductor device, and in particular, to a system and a method of testing electromagnetic interference (EMI) effecting a semiconductor device.

2. DESCRIPTION OF RELATED ART

A semiconductor fabrication process is complex and necessitates inspection. Therefore, it is necessary to test a semiconductor device for defects in order to manage the quality of the manufactured semiconductor device. Examining the semiconductor device for defects allows for defect detection and therefore increased reliability of the semiconductor device yielded in a process of fabricating the semiconductor device. Reliability of the semiconductor device may also be increased by testing and evaluating electromagnetic interference characteristics of the semiconductor device.

SUMMARY

The inventive concept provides for a system and a method of testing a semiconductor device in order to increase reliability.

According to an exemplary embodiment of the present inventive concept, a semiconductor device test system may include a body forming an internal space, in which a test device is loaded. A cover is coupled to the body to cover the internal space. The cover may further include a first cover including an array of first openings and a second cover including an array of second openings. An array of the first openings is different from an array of the second openings.

According to an exemplary embodiment of the present inventive concept, a method of testing a semiconductor device is provided. The method is performed using a semiconductor device test system including a body in which a test device is loaded. A first cover is coupled to the body and has first openings arranged in a first array. A second cover is coupled to the body and has second openings arranged in a second array different from the first array. The method includes loading the test device into the body and performing a first test process on the test device using the first cover. The method also includes performing a second test process on the test device using the second cover. The data obtained through the first and second test processes is overlapped to obtain test data on the test device.

According to exemplary embodiments of the present inventive concept, a method of fabricating a semiconductor device may include performing a packaging process on a semiconductor device. A test process may be performed on the semiconductor device after the packaging process. The performing of the test process may include loading the semiconductor device into a test socket. A first test process may be performed on the semiconductor device in which a test probe is inserted into first openings formed in a first cover covering the test socket. A second test process is performed on the semiconductor device in which a test probe is inserted into second openings which are formed in a second cover covering the test socket. The second openings are offset from the first openings when viewed from a plan view. Next, performing a step for overlapping data obtained through the first and second test processes.

BRIEF DESCRIPTION OF THE DRAWINGS

The above and other features of the present inventive concept will become more clearly understood from the following description taken in conjunction with the accompanying drawings, in which.

DETAILED DESCRIPTION OF THE EMBODIMENTS

Exemplary embodiments of the present inventive concept will now be described more fully with reference to the accompanying drawings.

Figure 1:
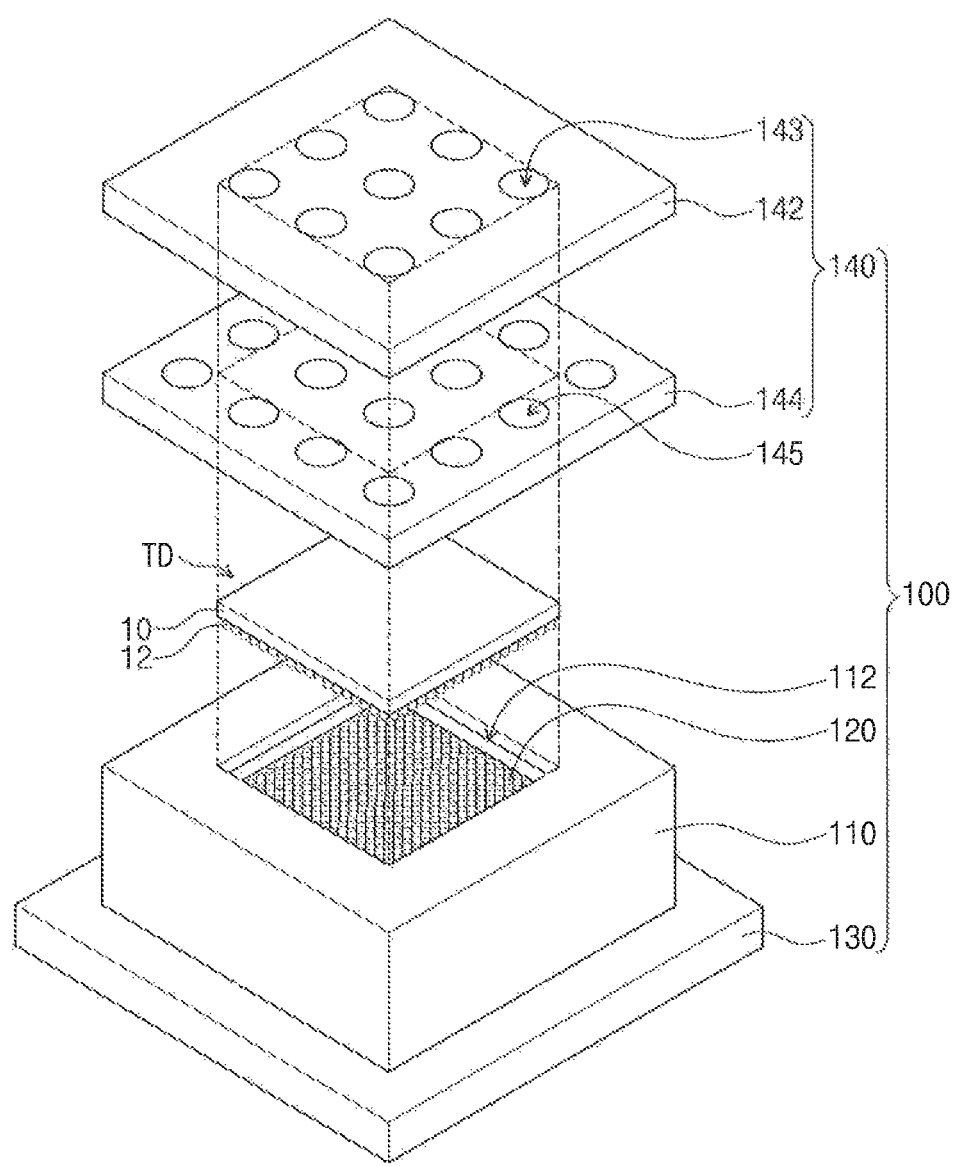
FIG. 1 is an exploded perspective view schematically illustrating a semiconductor device test system according to an exemplary embodiment of the present inventive concept.

FIG. 1 is an exploded perspective view schematically illustrating a semiconductor device test system 100 according to an exemplary embodiment of the present inventive concept. In the drawings of the present specification, for convenience in illustration and description, sizes of some of illustrated elements may be different from sizes of their actual shapes. The semiconductor device test system 100 may be, for example, a test socket structure. The semiconductor device test system 100 may include a body 110, pogo-pins 120, a test board 130, and a cover 140.

The body 110 may be mounted on the test board 130. The body 110 may be configured to provide an internal space 112 in which a test device TD is loaded. For example, the body 110 may have a hollow structure, but the inventive concept is not limited thereto. The body 110 may include a plastic material. According to an exemplary embodiment of the present inventive concept depicted in FIG. 1, a planar surface area of the test board 130 viewed from a plan view may be different from a planar surface area of the body 110. For example, side edges of the body 110 may have a uniform distance from adjacent side edges of the test board 130.

As shown in FIG. 1, the internal space 112 may be provided to correspond to the test device TD or to have the same size and shape as the test device TD, but the inventive concept is not limited thereto. According to the exemplary embodiment shown in FIG. 1, the internal space 112 may be a cavity formed in a side of the body 110 opposite to the side contacting the test board 130, but the inventive concept is not limited thereto.

The pogo-pins 120 may be provided in the internal space 112. According to an exemplary embodiment of the present inventive concept, the pogo-pins 120 may be disposed on a different plane than a plane of a surface of the body 110. For example, the pogo pins 120 may be recessed from a surface of the body 110 in the interior of the body 110. The pogo-pins 120 may be configured to contact respective external connection members 12 of the test device TD and may electrically connect the test device TD to the test board 130. The test board 130 may include, for example, a test-purposed printed circuit board (PCB). The test device TD may be a semiconductor device. The test device TD may include a single chip 10. The test device TD may further include the external connection members 12 provided under the single chip 10. The external connection members 12 may be solder balls and/or solder bumps. The test device TD may include a memory chip, but the inventive concept is not limited thereto. For example, the test device TD may be a dynamic random access memory (DRAM) chip, a semiconductor package, or an electronic device (e.g., a cellular phone). In the present specification, the terms "test device" and "semiconductor device" may be used interchangeably to refer to element TD.

The cover 140 may be combined with the body 110. The cover 140 may be coupled with the body 110 to seal the internal space 112. The cover 140 may include a first cover 142 and a second cover 144 which may have a substantially similar width and length, but are not limited thereto.

The first cover 142 may include a plurality of first openings 143. The first openings 143 may be provided to penetrate the first cover 142. The first openings 143 may be two-dimensionally arranged in the first cover 142. For example, the first openings 143 may be formed as rows extending in a first direction and columns extending in a second direction intersecting the first direction. Each of the first openings 143 may be configured to allow a test probe P, which will be described in further detail with reference to FIG. 6A, to be inserted therein. A size of each of the first openings 143 may be larger than or equal to a size of the test probe P. According to an exemplary embodiment of the present inventive concept, the size of the test probe P may correspond to a diameter and/or sectional area of the first openings 143. The first cover 142 may include a plastic material. For example, the plastic material selected may be a plastic that does not exert or interact with electromagnetic forces. The second cover 144 may include second openings 145. The second openings 145 may be provided to penetrate the second cover 144. The second openings 145 may be two-dimensionally arranged in the second cover 144. For example, the second openings 145 may be formed in rows and columns. The arrangement of the second openings 145 may be different from the arrangement of the first openings 143. Each of the second openings 145 may be configured to allow the test probe P to be inserted therein. A size of each of the second openings 145 may be larger than or equal to the size of the test probe P. The second cover 144 may include a plastic material. For example, the plastic material selected may include a plastic that does not exert or interact with electromagnetic forces.

In the present specification, the arrangement of the openings may represent how the openings are arranged on a plane. For example, the arrangement of the openings may be dependent on the number and/or sizes of the openings, a distance between centers of the openings, or a density of the openings.

In addition, the semiconductor device test system 100 may further include a controller. The controller may be configured to control the body 110, the pogo-pins 120, the test board 130, and the cover 140. In addition, the controller may control the test probe P during a test process to be described in detail below. The controller may include a display part which is used to display a test result. Furthermore, an additional fixing part may be provided on a bottom surface of the cover 140 to fix the test device TD.

Figure 2A:
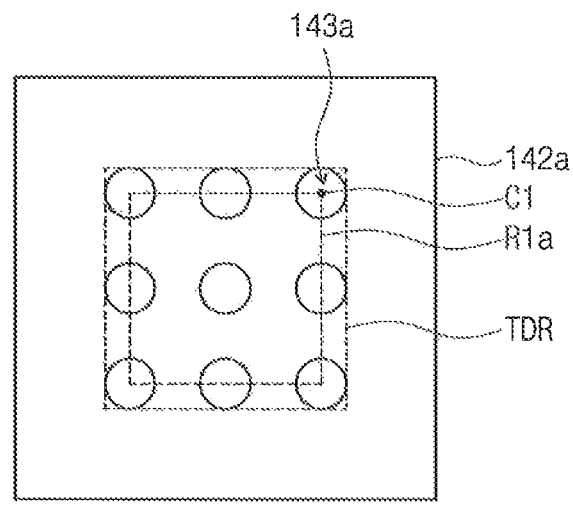
FIG. 2A is a plan view illustrating a first cover according to an exemplary embodiment of the present inventive concept.
Figure 2B:
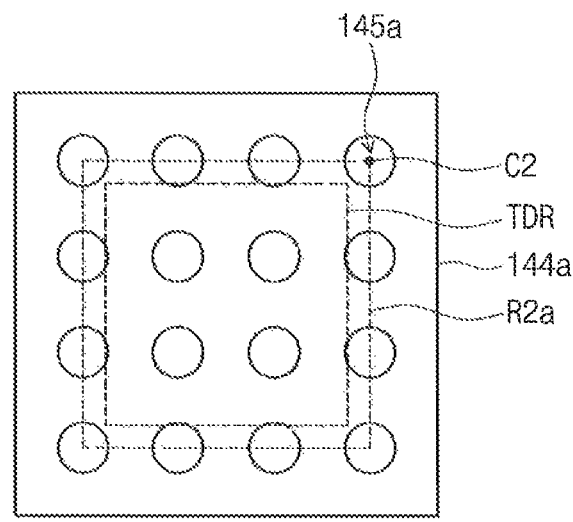
FIG. 2B is a plan view illustrating a second cover according to an exemplary embodiment of the present inventive concept.
Figure 2C:
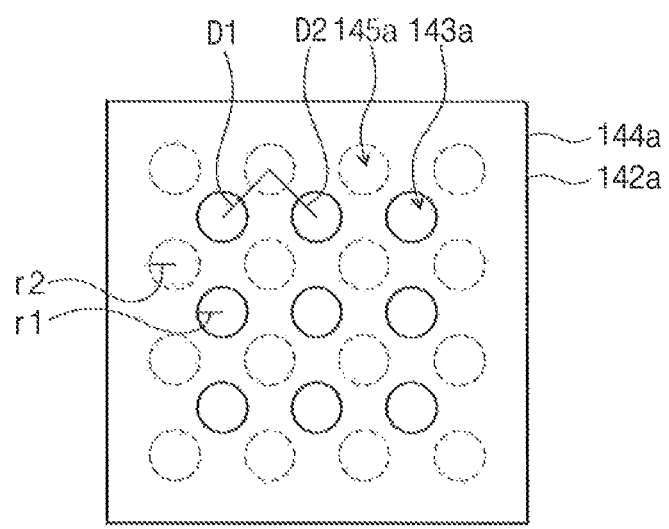
FIG. 2C is a plan view illustrating the first cover of FIG. 2A and the second cover of FIG. 2B overlapping one another.

FIG. 2A is a plan view illustrating a first cover 142a according to an exemplary embodiment of the present inventive concept. FIG. 2B illustrates a second cover 144a according to an exemplary embodiment of the present inventive concept. For comparison in area between the first or second cover 142a or 144a and the test device TD, a region TDR, whose area corresponds to the size of the test device TD, is illustrated in FIGS. 2A and 2B. FIG. 2C illustrates the first cover 142a of FIG. 2A and the second cover 144a of FIG. 2B overlapping one another. FIG. 2C illustrates the overlap between the first cover 142a of FIG. 2A and the second cover 144a of FIG. 2B. First openings 143a are depicted by solid lines, and second openings 145a are depicted by dotted lines. The first cover 142a and the second cover 144a will be described in more detail with reference to FIGS. 2A to 2C.

Referring to FIG. 2A, the first cover 142a may include the first openings 143a. The first openings 143a may be two-dimensionally arranged in the first cover 142a. For example, the first openings 143a may be arranged into rows extending in a first direction and columns extending in a second direction intersecting the first direction. The first openings 143a may be arranged, for example, in the form of 3×3 matrix. When viewed in a plan view, a first region R1a is defined by a line connecting centers C1 of outermost ones of the first openings 143a. For example, a first region R1a may be delimited by a line connecting centers C1 of the first openings 143a that comprise the perimeter of the arrangement of first openings 143a. According to an exemplary embodiment of the present inventive concept, the first region R1a may be overlapped with the test device region TDR. For example, when viewed from a plan view, the test device region TDR may have a greater planar area than the first region R1a, and thus might be only partially overlapped by the first region R1a, but the inventive concept is not limited thereto. Referring to FIG. 2B, the second cover 144a may include the second openings 145a. The second openings 145a may be two-dimensionally arranged in the second cover 144a. For example, the second openings 145a may be arranged into rows extending in a first direction and columns extending in a second direction intersecting the first direction. The arrangement of the second openings 145a may be different from the arrangement of the first openings 143a. The number of the second openings 145a may be different from the number of the first openings 143a. For example, the number of the second openings 145a may be greater than the number of the first openings 143a. The second openings 145a may be arranged in the form of 4×4 matrix.

When viewed from a plan view, the test device region TDR may be overlapped with a second region R2a, which is delimited by a line connecting centers C2 of the outermost ones of the second openings 145a. For example, a second region R2a may be delimited by a line connecting centers C2 of the second openings 145a that comprise the perimeter of the arrangement of second openings 145a. In other words, a portion of the second region R2a may be overlapped with the test device region TDR. For example, the second region R2a may have a larger planar area in a plan view relative to the test device region TDR. When viewed from a plan view, the first region R1a may be overlapped with the second region R2a. In other words, when viewed from a plan view, a portion of the second region R2a may be overlapped with the first region R1a. For example, the first region R1a may have a smaller planar area than the second region R2a when observed from a plan view.

Referring to FIG. 2C, a size of the first opening 143a may be substantially the same as a size of the second opening 145a. In other words, a radius r1 of the first openings 143a may be substantially the same as a radius r2 of the second openings 145a. Distances D1 and D2 represent distances between centers of two adjacent arbitrary openings of the first openings 143a to a second opening 145a adjacent thereto. Distances D1 and D2 may be substantially equal to each other. According to the exemplary embodiment illustrated in FIG. 2C, the first openings 143a and the second openings 145a may be staggered with respect to one another.

According to an exemplary embodiment of the present inventive concept, characteristics of the test device TD may be tested by inserting a test probe into each of the first openings 143a and the second openings 145a of the first cover 142a and the second cover 144a, respectively. The test probe may be inserted into the first and second openings 143a and 145a to contact a surface of the test device TD. The test probe may be used to test the characteristics of the test device TD at positions corresponding to the first and second openings 143a and 145a. Since the first openings 143a and the second openings 145a are offset from one another when viewed from a plan view, it is possible to reduce an average distance between regions to be tested by the test probe. Accordingly, it is possible to increase reliability and precision in the test process. In addition, it is possible to perform a test process on the test device TD without an additional soldering process, and thus, it is possible to prevent the test device TD from incurring thermal damage.

Figure 3A:
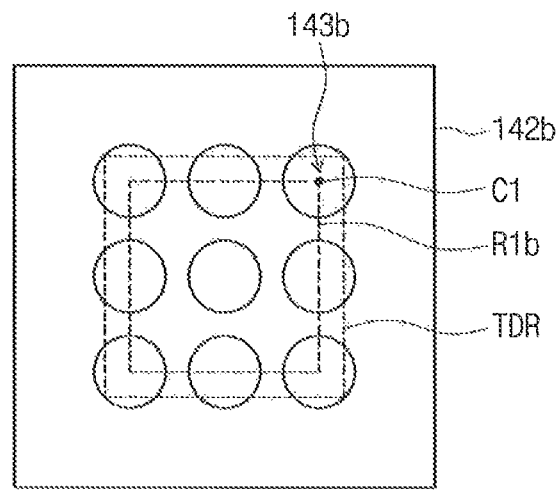
FIG. 3A is a plan view illustrating a first cover according to an exemplary embodiment of the present inventive concept.
Figure 3B:
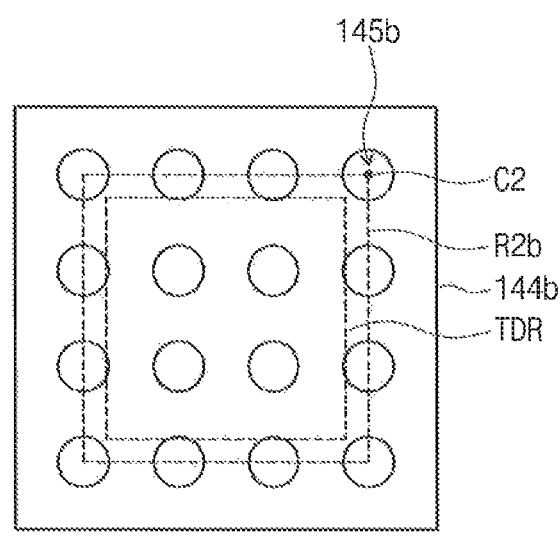
FIG. 3B is a plan view illustrating a second cover according to an exemplary embodiment of the present inventive concept.
Figure 3C:
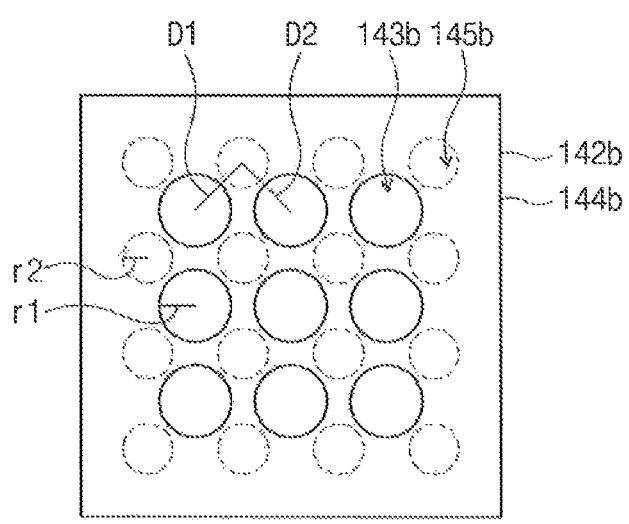
FIG. 3C is a plan view illustrating the first cover of FIG. 3A and the second cover of FIG. 3B overlapping one another.

FIG. 3A illustrates a first cover 142b according to an exemplary embodiment of the present inventive concept. FIG. 3B illustrates a second cover 144b according to an exemplary embodiment of the present inventive concept. A region TDR, whose area corresponds to the size of the test device TD, is illustrated in FIGS. 3A and 3B to show the comparative areas of the first cover 142b and the second cover 144b in relation to the test device TD. FIG. 3C illustrates the first cover 142b of FIG. 3A and the second cover 144b of FIG. 3B overlapped with each other. FIG. 3C is a plan view illustrating the overlap between the first cover 142b of FIG. 3A and the second cover 144b of FIG. 3B. First openings 143b are depicted by solid lines, and second openings 145b are depicted by dotted lines. The first cover 142b and the second cover 144b will be described in more detail with reference to FIGS. 3A to 3C.

Referring to FIG. 3A, the first cover 142b may include the first openings 143b. The first openings 143b may be two-dimensionally arranged in the first cover 142b. The first openings 143b may be arranged in the form of 3×3 matrix. When viewed from a plan view, a first region R1b delimited by a line connecting the centers C1 of the outermost ones of the first openings 143b may be overlapped with the test device region TDR. In other words, when viewed from a plan view, a portion of the test device region TDR may be overlapped with the first region R1b.

Referring to FIG. 3B, the second cover 144b may include the second openings 145b. The second openings 145b may be two-dimensionally arranged in the second cover 144b. The arrangement of the second openings 145b may be different from the arrangement of the first openings 143b. The number of the second openings 145b may be different from the number of the first openings 143b. The number of the second openings 145b may be greater than the number of the first openings 143b. The second openings 145b may be arranged in the form of 4×4 matrix.

When viewed from a plan view, the test device region TDR may be overlapped with a second region R2b. The second region R2b is delimited by a line connecting the centers C2 of the outermost ones of the second openings 145b. In other words, when viewed from a plan view, a portion of the second region R2b may be overlapped with the test device region TDR. When viewed from a plan view, the first region R1b may be overlapped with the second region R2b. For example, when viewed from a plan view, a portion of the second region R2b may be overlapped with the first region R1b.

Referring to FIG. 3C, a size of the first opening 143b may be different from that of the second opening 145b. For example, the size of the first opening 143b may be greater than the size of the second opening 145b, therefore a radius r1 of the first opening 143b may be different from a radius r2 of the second opening 145b. Distances D1 and D2 represent distances between centers of two adjacent arbitrary openings of the first openings 143b to the second opening 145b adjacent thereto. Distances D1 and D2 may be substantially equal to each other. According to an exemplary embodiment of the present inventive concept, the first openings 143b and the second openings 145b may be staggered with respect to one another. However, the inventive concept is not limited thereto. For example, some of the first openings 143b and the second openings 145b may partially overlap one another, while others do not.

According to an exemplary embodiment of the present inventive concept, the first cover 142b and the second cover 144b are used to test characteristics of the test device TD. Test probes of different types may be inserted into respective ones of the first openings 143b and ones of the second openings 145b. For example, since the first openings 143b and the second openings 145b have different sizes, test probes of different types may be inserted into the first openings 143b and the second openings 145b when the characteristics of the test device TD are tested. A type of test probe to be inserted into each of the openings may be selected based upon the purpose and effect of the test process to be performed. In addition, since the first openings 143b and the second openings 145b have different sizes offset from each other, it is possible to reduce an average distance between regions to be tested by the test probes. However, the present inventive concept is not limited thereto. According to an exemplary embodiment, some of the first and second openings 143b and 145b may partially overlap one another. Accordingly, it is possible to increase reliability and precision in the testing process.

Figure 4A:
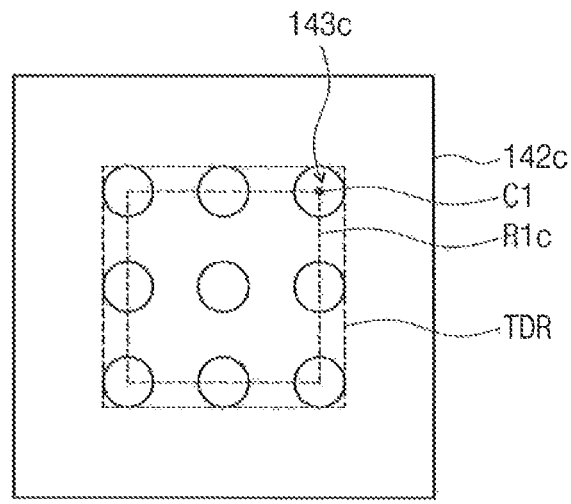
FIG. 4A is a plan view illustrating a first cover according to an exemplary embodiment of the present inventive concept.
Figure 4B:
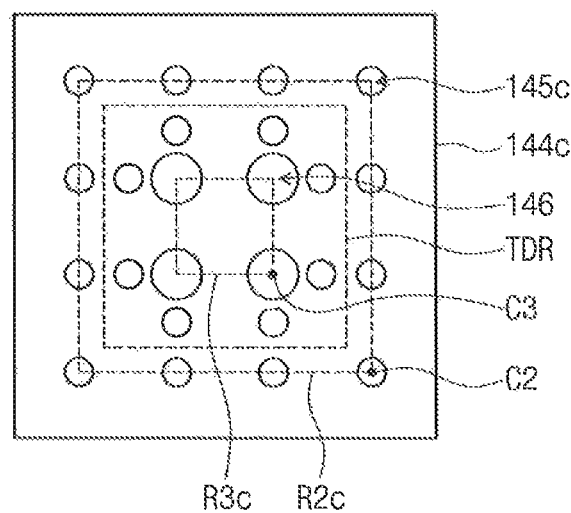
FIG. 4B is a plan view illustrating a second cover according to an exemplary embodiment of the present inventive concept.
Figure 4C:
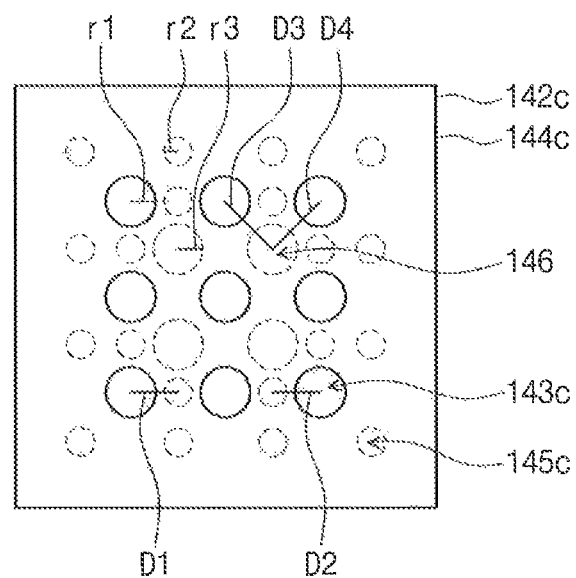
FIG. 4C is a plan view illustrating the first cover of FIG. 4A and the second cover of FIG. 4B overlapping one another.

FIG. 4A illustrates a first cover 142c according to an exemplary embodiment of the present inventive concept. FIG. 4B illustrates a second cover 144c according to an exemplary embodiment of the present inventive concept. For comparison of the relative areas of the first and second cover 142c or 144c in relation to the test device TD, a region TDR is illustrated in FIGS. 4A and 4B with an area that corresponds to the size of the test device TD. FIG. 4C illustrates the first cover 142c of FIG. 4A and the second cover 144c of FIG. 4B, which overlap each other. In FIG. 4C illustrating the overlap between the first cover 142c of FIG. 4A and the second cover 144c of FIG. 4B, first openings 143c are depicted by solid lines, and second openings 145c are depicted by dotted lines. The first cover 142c and the second cover 144c will be described in more detail with reference to FIGS. 4A to 4C.

Referring to FIG. 4A, the first cover 142c may include the first openings 143c. The first openings 143c may be two-dimensionally arranged in the first cover 142c. According to an exemplary embodiment of the present inventive concept, the first openings 143c may be arranged into rows extending in a first direction and columns extending in a second direction intersecting the first direction. For example, the first openings 143c may be arranged in the form of 3×3 matrix. When viewed from a plan view, a first region R1c is delimited by a line connecting the centers C1 of outermost first openings 143c, and may be overlapped with the semiconductor device region TDR. In other words, when viewed from a plan view, a portion of the semiconductor device region TDR may be overlapped with the first region R1c.

Referring to FIG. 4B, the second cover 144c includes the second openings 145c. The second openings 145c may be two-dimensionally arranged in the second cover 144c. The arrangement of the second openings 145c may be different from the arrangement of the first openings 143c. The number of the second openings 145c may be different from the number of the first openings 143c. The number of the second openings 145c may be greater than the number of the first openings 143c.

The second cover 144c may further include third openings 146. The arrangement of the third openings 146 may be different from the arrangement of the first openings 143c and the arrangement of the second openings 145c. As an example, a region of the second cover 144c in which the third openings 146 are formed may be overlapped with a center region of the test device region TDR, and a region of the second cover 144c in which the second openings 145c are formed may be overlapped with an edge region of the test device region TDR.

When viewed from a plan view, the test device region TDR may be overlapped with a second region R2c, which is delimited by a line connecting the centers C2 of outermost second openings 145c. In other words, when viewed from a plan view, a portion of the second region R2c may be overlapped with the semiconductor device region TDR. When viewed from a plan view, a third region R3c, which is delimited by a line connecting centers C3 of the outermost ones of the third openings 146, may be overlapped with the test device region TDR. In other words, when viewed from a plan view, a portion of the test device region TDR may be overlapped with the third region R3c. Although not shown, when viewed from a plan view, the first region R1c may be overlapped with the second region R2c. In other words, when viewed from a plan view, a portion of the second region R2c may be overlapped with the first region R1c.

Referring to FIG. 4C, a radius r1 of the first opening 143c may be different from a radius r2 of the second opening 145c. The size of the first openings 143c may be greater than the size of the second openings 145c. Distances D1 and D2 represent distances from centers of two adjacent arbitrary openings of the first openings 143c to the second opening 145c adjacent thereto, and may be substantially equal to one another. A radius r3 of the third opening 146 may be substantially equal to the radius r1 of the first opening 143c. According to an exemplary embodiment of the present inventive concept, the radius r3 of the third opening 146 may be different from the radius r2 of the second opening 145c. For example, the size of the third opening 146 may be greater than the size of the second opening 145c. Distances D3 and D4 represent distances from centers of two adjacent arbitrary openings of the first openings 143c to the third opening 146 adjacent thereto. Distances D3 and D4 may be substantially equal to one another.

According to an exemplary embodiment of the present inventive concept, in the case where the first cover 142c and the second cover 144c are used to test characteristics of the test device TD, different types of test probes may be used to test the characteristics of the test device TD. The different types of test probes may be inserted into each of the first openings 143c, the second openings 145c, and the third openings 146. In other words, since the first openings 143c, the second openings 145c, and the third openings 146 may have different sizes, test probes of different types may be inserted into the first openings 143c, the second openings 145c, and the third openings 146, respectively. A type of a test probe to be inserted into each of the openings may be selected based upon the purpose and effect of the test process to be performed. For example, the test probe utilized may be an E-field/H-field test probe equipped to take measurements in the x, y, and/or z planes. In addition, a density of the test probes inserted into the various openings may vary depending on a position on the test device TD. As an example, a density of test regions may be higher in the edge region of the test device TD than in the center region of the test device TD when it is necessary to more precisely perform the test process on the edge region of the test device TD rather than on the center region of the test device TD. Accordingly, it is possible to increase reliability and precision in the test process.

Figure 5:
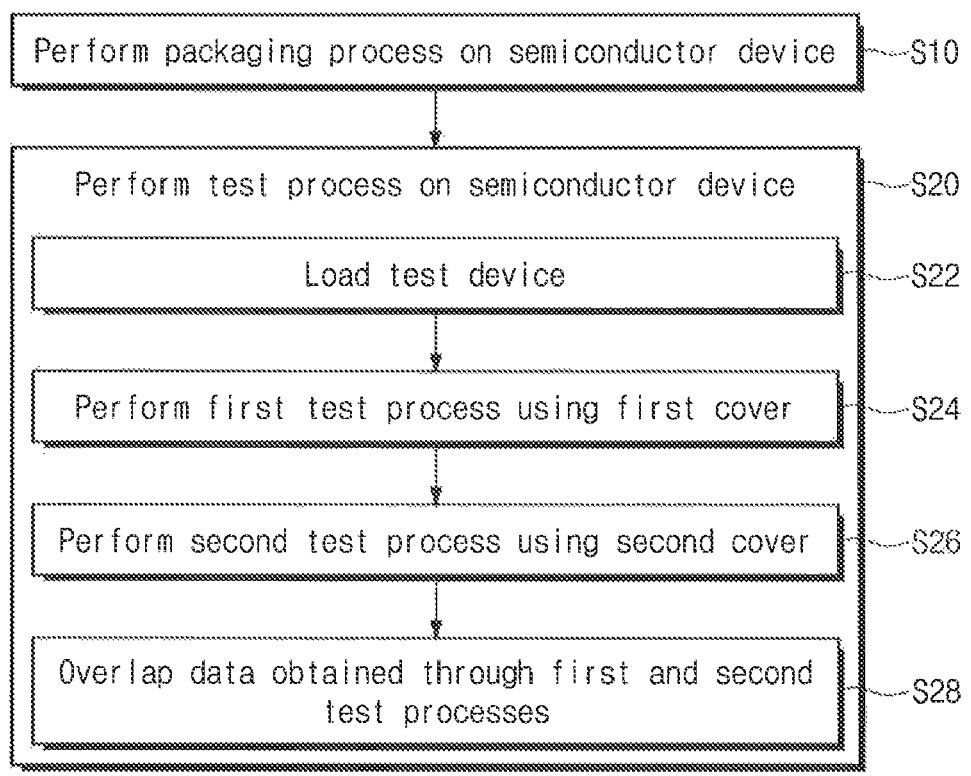
FIG. 5 is a flow chart illustrating a process of fabricating a semiconductor device using a semiconductor device test system according to FIG. 1, according to an exemplary embodiment of the present inventive concept.

FIG. 5 is a flow chart illustrating a process of fabricating a semiconductor device using the semiconductor device test system 100 of FIG. 1.

A packaging process may be performed on a semiconductor device (S10). The semiconductor device may include a memory chip. As an example, the packaging process may include supplying an epoxy molding compound to encapsulate a memory chip, and forming a mold layer to protect the memory chip.

After the packaging process, a step to perform a test process on the semiconductor device (S20) may be performed. The test process may include a process of testing the quality and/or characteristics of the semiconductor device. As an example, the test process may include a process of testing electromagnetic interference characteristics of the semiconductor device. The test process of the semiconductor device may include a step to load a test device (S22), performing a first test process using a first cover (S24), performing a second test process using a second cover (S26), and overlapping test data obtained through the first and second test processes (S28).

FIGS. 6A to 6D are diagrams illustrating a process of testing the semiconductor device TD using the first and second covers 142a and 144a of FIGS. 2A to 2C, respectively.

Figure 6A:
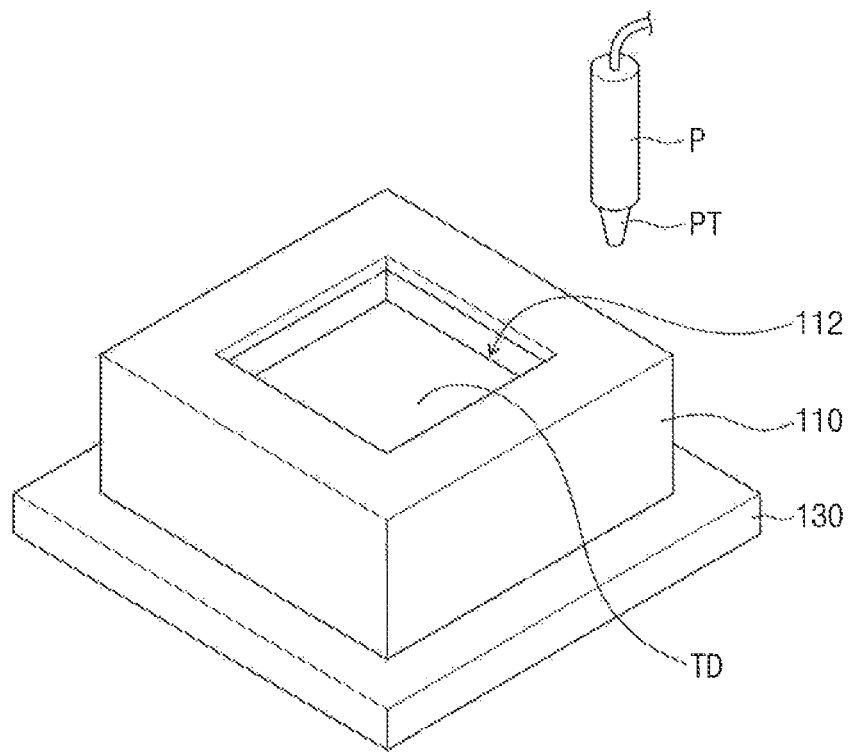
FIGS. 6A, 6B, 6C and 6D are diagrams illustrating a process of testing a semiconductor device using the first and second covers of FIGS. 2A to 2C, according to an exemplary embodiment of the present inventive concept.

Referring to FIGS. 5 and 6A, the step to load the test device TD (S22) may include loading the test device TD into the internal space 112 of the body 110 of the semiconductor device test system. A handler may be provided to transport the semiconductor device TD. As an example, the semiconductor device TD may be fastened to the handler for transport by the handler.

A test probe P for the test process may be prepared. The test probe P may include a test probe tip PT, which is provided as a lower portion thereof. The test probe tip PT may directly contact the semiconductor device TD during a test process.

Figure 6B:
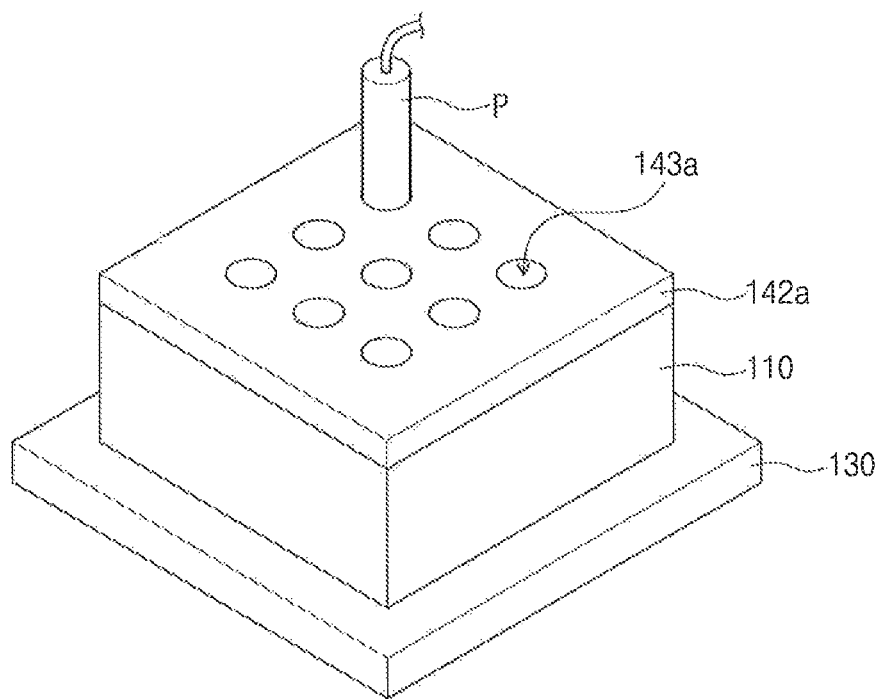
Figure 6C:
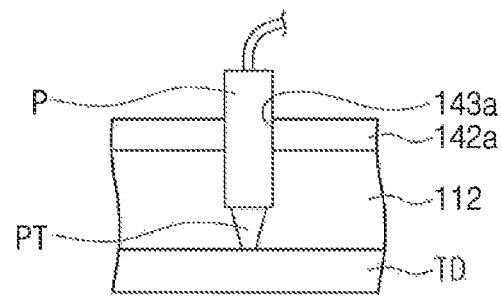

Referring to FIGS. 5, 6B, and 6C, the first test process may be performed on the semiconductor device TI) (S24) using the first cover 142a. After loading the semiconductor device TD, the first cover 142a may be coupled to the body 110 to cover the semiconductor device TD. The test probe P may be inserted into one of the first openings 143a of the first cover 142a. The test probe P may be inserted into the first opening 143a such that the test probe tip PT is in contact with a surface of the semiconductor device TD. According to an exemplary embodiment of the present inventive concept, a gap attributed to the internal space 112 may exist between an upper surface of the semiconductor device TD and the first cover 142a such that a lateral surface of the test probe P may be exposed in the gap while the test probe tip PT is in contact with the semiconductor device TD. The test probe P may test EMI characteristics of the semiconductor device TD at a region in contact with the test probe P. If the test process at one of the first openings 143a is finished, the test probe P may be used to further perform the test process at remaining first openings 143a.

Figure 6D:
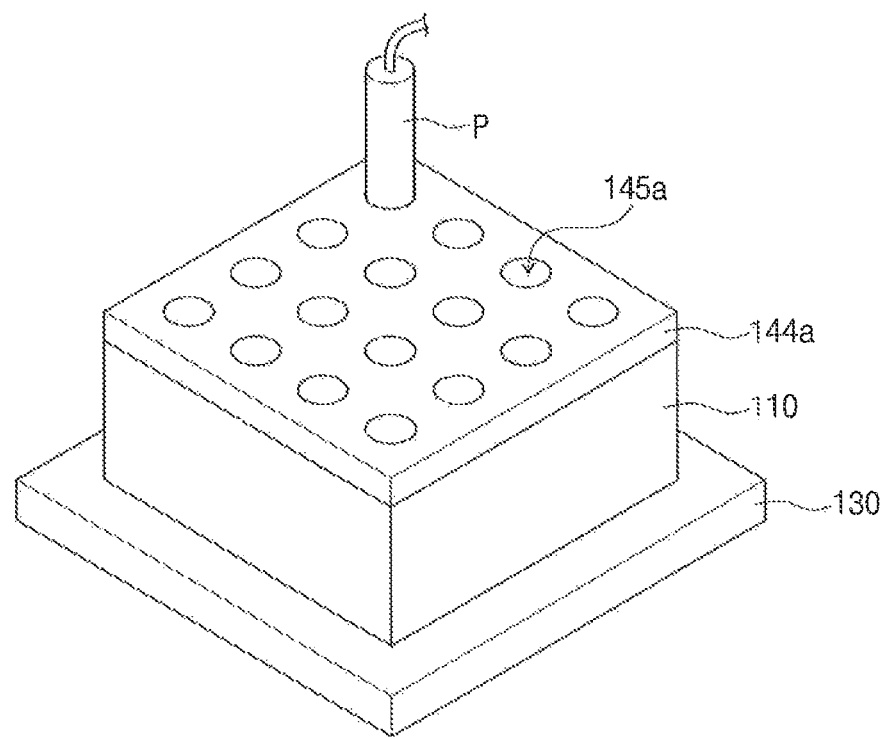

Referring to FIGS. 5 and 6D, the second test process may be performed on the semiconductor device TD using the second cover 144a (S26). According to an exemplary embodiment of the present inventive concept, the second cover 144a (instead of the first cover 142a) may be coupled to the body 110 to cover the semiconductor device TD situated in the internal space 112. The test probe P may be inserted into one of the second openings 145a of the second cover 144a. The test probe P may contact the surface of the semiconductor device TD through the second openings 145a. The test probe P may test EMI characteristics of the semiconductor device TD at a region in contact with the test probe P. When the test process at one of the second openings 145a is finished, the test probe P may be used to perform the test process at remaining second openings 145a.

The first test process and the second test processes may be similar to each other, and may be performed on the semiconductor device TD using the same test probe P.

Thereafter, test data obtained through the first and second test processes may be overlapped (S28). The test data obtained through the first test process and the second test processes may be overlapped. In other words, the test data obtained through the first and second processes may be combined to obtain a test result on the entire region of the semiconductor device TD. For example, the test result may be used to produce an intensity graph of the entire semiconductor device TD.

Figure 7A:
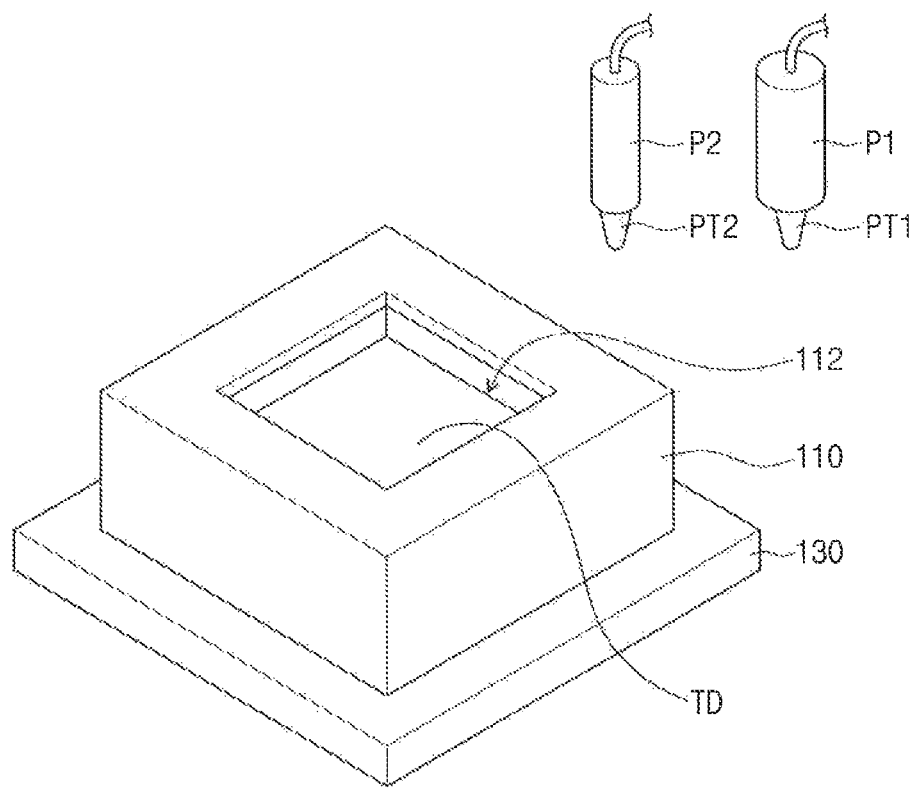
FIGS. 7A, 7B and 7C are diagrams illustrating a process of testing a semiconductor device using the first and second covers of FIGS. 3A to 3C, according to an exemplary embodiment of the present inventive concept.
Figure 7B:
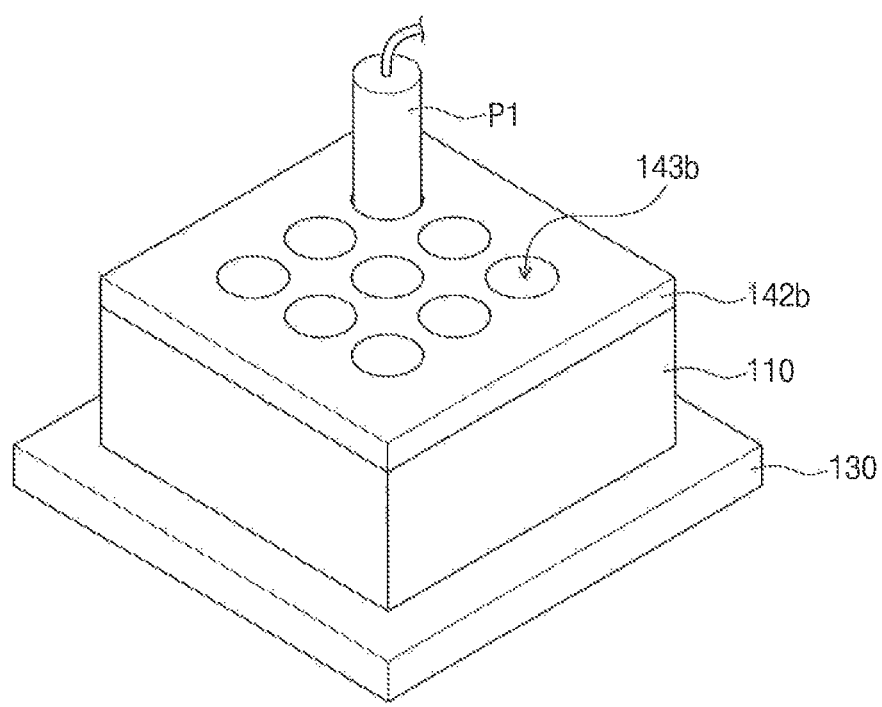
Figure 7C:
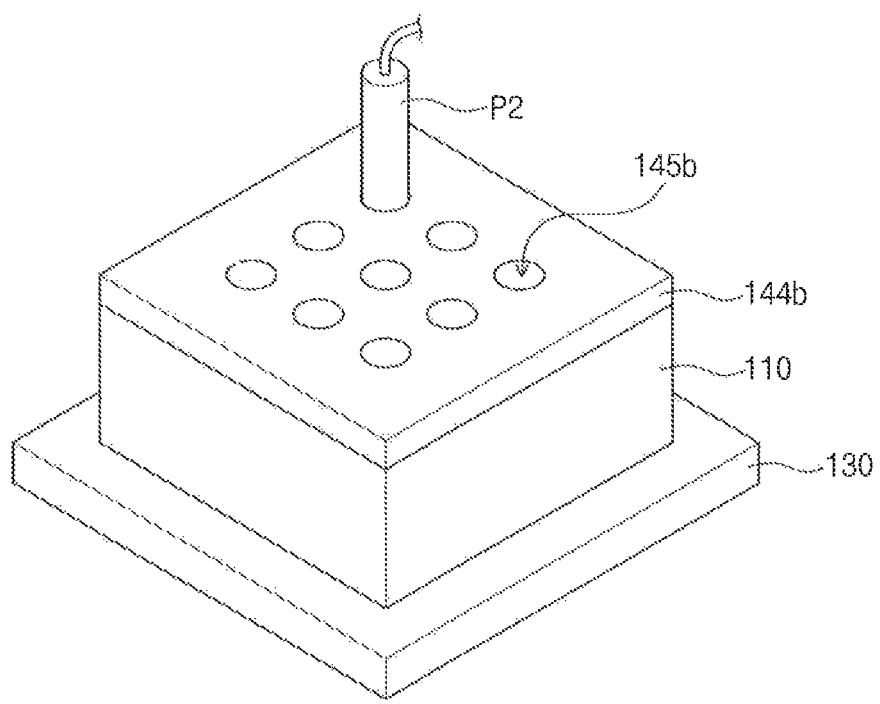

FIGS. 7A to 7C are diagrams illustrating a process of testing the semiconductor device TD using the first and second covers 142b and 144b of FIGS. 3A to 3C.

Referring to FIGS. 5 and 7A, the test device TD may be loaded into the internal space 112 of the body 110 of the semiconductor device test system (S22). Test probes P1 and P2 may be prepared for the test process. The first test probe P1 and the second test probe P2 may be separate test probes that are different from each other. The test probes P1 and P2 may further include test probe tips PT1 and PT2, respectively, each of which is provided as a lower portion of respective test probes P1 and P2. Test probe tips PT1 and PT2 may be in direct contact with the semiconductor device TD during a test process.

Referring to FIGS. 5 and 7B, a test process may be performed on the semiconductor device TD using the first cover (S24). After loading the semiconductor device TD into the internal space 112, the first cover 142b may be coupled to the body 110 to cover the semiconductor device TD. The first test probe P1 may be inserted into one of the first openings 143b of the first cover 142b. The first test probe P1 may contact the surface of the semiconductor device TD through the first opening 143b. The first test probe P1 may test EMI characteristics of the semiconductor device TD at a region in contact with the first test probe P1. When the test process at one of the first openings 143b is finished, the first test probe P1 may be used to perform the test process at remaining first openings 143b.

Referring to FIGS. 5 and 7C, a second test process may be performed on the semiconductor device TD using the second cover 144b (S26). According to an exemplary embodiment of the present inventive concept, the second cover 144b (instead of the first cover 142b) may be coupled to the body 110 to cover the semiconductor device TD situated in the internal space 112. The second test probe P2 may be inserted into one of the second openings 145b of the second cover 144b. The second test probe P2 may contact the surface of the semiconductor device TI) through the second openings 145b. The second test probe P2 may test EMI characteristics of the semiconductor device TD at a region in contact with the second test probe P2. If the test process at one of the second openings 145b is finished, the second test probe P2 may be used to perform the test process at remaining second openings 145b.

The first test process and the second test process may be performed on the semiconductor device TD using the test probes P1 and P2, which may also be different from each other. As an example, the first test probe P1 may be used to perform the test process on only a specific bandwidth, unlike the second test probe P2. According to exemplary embodiments of the present inventive concept, the first test probe P1 may have a higher sensitivity compared with the second test probe P2.

Test data obtained through the first and second test processes may then be overlapped (S28). The test data obtained through the first test process and the second test process may be overlapped to obtain a test result, or test data, on the entire region of the semiconductor device TD. For example, the test result may be used to produce an intensity graph of the entire semiconductor device TD.

Figure 8:
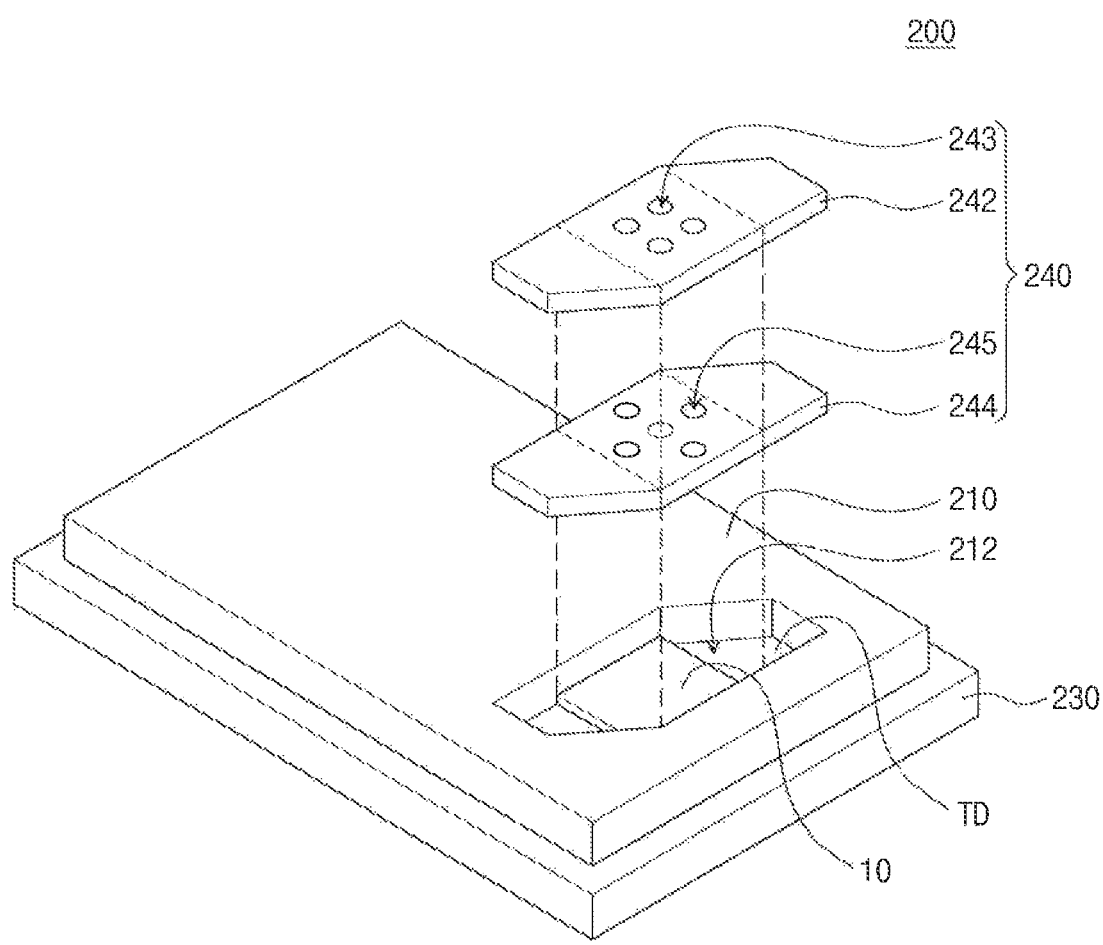
FIG. 8 is a diagram schematically illustrating a semiconductor device test system according to an exemplary embodiment of the present inventive concept.

FIG. 8 is a diagram schematically illustrating a semiconductor device test system 200 according to an exemplary embodiment of the present inventive concept. The semiconductor device test system 200 may include a body 210, an internal space 212, pogo-pins, a test board 230, and a cover 240. The cover 240 may include a first cover 242 and a second cover 244. The first cover 242 may have first openings 243. The second cover 244 may have second openings 245. The body 210, the internal space 212, the test board 230, and the cover 240 of FIG. 8 may be substantially the same as or similar to the body 110, the internal space 112, the test board 130, and the cover 140 of the semiconductor device test system 100 described with reference to FIG. 1. A detailed description thereof will therefore be omitted. The test device TD, to which the semiconductor device test system 200 of FIG. 8 is used, may be an electronic device including a chip 10. As an example, the test device TD may be a portable phone in which a case is opened and the chip 10 is exposed.

In an exemplary embodiment of the present inventive concept, the covers 140 and 240 have been described to include two covers (e.g., the first and second covers). However, according other exemplary embodiments of the present inventive concept, the covers 140 and 240 may include three or more covers. In addition, as described above, the cover 140 or 240 may be configured to have openings, whose arrangement may be changed depending on a particular test process. Furthermore, the arrangement of the openings 243 and 245 may be variously changed in consideration of characteristics of the corresponding test device TD. In an exemplary embodiment illustrated in FIG. 8, the cover 240 may have an irregular hexagonal shape. For example, the shape of the cover 240 may comprise two parallel sides spaced apart by a first width and offset from one another; a perpendicular side extending from the parallel side as a second width shorter than the first width, in which diagonal lines connect the perpendicular sides with the opposite parallel side from which they extend.

According to an exemplary embodiment of the present inventive concept, it may be possible to provide a system and a method of testing a semiconductor device to increase reliability and precision.

While exemplary embodiments of the present inventive concept has been particularly shown and described, it will be understood by one of ordinary skill in the art that variations in form and detail may be made therein without departing from the spirit and scope of the accompanying claims.

What is claimed is:

1. A semiconductor device test system, comprising:
   a body including an internal space, in which a test device is loaded; and
   a cover coupled to the body to cover the internal space, wherein the cover extends in a direction substantially parallel to a bottom surface of the internal space, and the cover comprises:
   a first cover including first openings; and
   a second cover including second openings, and an arrangement of the first openings is different from an arrangement of the second openings, wherein the first cover and the second cover overlap each other in a direction substantially perpendicular to the bottom surface of the internal space,
   wherein the second cover further includes third openings whose arrangement is different from the arrangement of the second openings,
   wherein, when viewed in a plan view, a first portion of the second cover in which the second openings are formed, is overlapped by an edge of the test device, and a second portion of the second cover in which the third openings are formed is overlapped by a center region of the test device, wherein distances from centers of two adjacent openings of the first openings to one of the second openings adjacent thereto are substantially equal to one another.

2. The semiconductor device test system of claim 1, wherein the first openings are offset from the second openings, respectively, when viewed in the plan view.

3. The semiconductor device test system of claim 1, wherein centers of the first openings are offset from centers of the second openings, respectively, when viewed in the plan view.

4. The semiconductor device test system of claim 1, wherein, when viewed in the plan view, a first region, which is defined by a line connecting centers of outermost ones of the first openings, is overlapped with a second region, which is defined by a line connecting centers of outermost ones of the second openings.

5. The semiconductor device test system of claim 4, wherein, when viewed in the plan view, the first region has a smaller area than the test device, and the test device has a smaller area than the second region.

6. The semiconductor device test system of claim 1, wherein a size of each of the first openings and the second openings is equal to or larger than a size of a test probe.

7. The semiconductor device test system of claim 1, wherein a size of each of the first openings is substantially equal to a size of each of the second openings.

8. The semiconductor device test system of claim 1, wherein a number of the first openings is different from a number of the second openings.

9. The semiconductor device test system of claim 1, wherein the first openings are arranged in a 3×3 matrix, and the second openings are arranged in a 4×4 matrix.

10. The semiconductor device test system of claim 1, wherein a size of one of the first openings is different from a size of one of the second openings.

11. The semiconductor device test system of claim 1, wherein the first cover or the second cover includes a plastic material.

12. A semiconductor device test system, comprising:
   a body including an internal space, in which a test device is loaded;
   a first cover selectively coupled to the body to cover the internal space, wherein the first cover includes first openings; and
   a second cover selectively coupled to the body to cover the internal space, wherein the second cover includes second openings,
   wherein an arrangement of the first openings is different from an arrangement of the second openings,
   wherein the second cover further includes third openings whose arrangement is different from the arrangement of the second openings,
   wherein, when viewed in a plan view, a first portion of the second cover in which the second openings are formed, is overlapped by an edge of the test device, and a second portion of the second cover in which the third openings are formed is overlapped by a center region of the test device, wherein distances from centers of two adjacent openings of the first openings to one of the second openings adjacent thereto are substantially equal to one another.

13. A semiconductor device test system, comprising:
   a body including an internal space, in which a test device is loaded;

a first cover coupled to the body to cover the internal space, wherein the first cover includes first openings; and a second cover coupled to the body to cover the internal space, wherein the second cover includes second openings, wherein an arrangement of the first openings is different from an arrangement of the second openings, wherein an area of the first cover in a plan view is equal to an area of the second cover in the plan view, wherein the second cover further includes third openings whose arrangement is different from the arrangement of the second openings, wherein, when viewed in the plan view, a first portion of the second cover in which the second openings are formed, is overlapped by an edge of the test device, and a second portion of the second cover in which the third openings are formed is overlapped by a center region of the test device, wherein distances from centers of two adjacent openings of the first openings to one of the second openings adjacent thereto are substantially equal to one another.

* * * * *